United States Patent [19]
Zhang et al.

[11] Patent Number: 5,694,362
[45] Date of Patent: Dec. 2, 1997

[54] METHOD AND APPARATUS FOR HIGH SPEED COMPARISON

[75] Inventors: Kevin Xiaoqiang Zhang; George McNeil Lattimore, both of Austin; Terry Lee Leasure, Georgetown, all of Tex.

[73] Assignee: International Business Machines Corporation, Armonk, N.Y.

[21] Appl. No.: 668,880

[22] Filed: Jun. 24, 1996

[51] Int. Cl.$^6$ .................................................. G11C 7/00
[52] U.S. Cl. ........................ 365/189.07; 365/189.09; 365/49; 365/203
[58] Field of Search .................. 365/189.07, 189.09, 365/49, 203, 205

[56] References Cited

U.S. PATENT DOCUMENTS 5,428,565  6/1995  Shaw ..................................... 365/49
5,528,541  6/1996  Ghia et al. ........................... 365/203

FOREIGN PATENT DOCUMENTS 61-113196  5/1986  Japan.

Primary Examiner—David C. Nelms
Assistant Examiner—Huan Hoang
Attorney, Agent, or Firm—Matthew G. Reeves

[57] ABSTRACT

According to the present invention, a comparison circuit for combining a plurality of data bits is provided. One version of the invention includes a comparator which provides a signal responsive to a comparison of the voltage states of at least two of the plurality of data bits, and an amplifier which is coupled to the comparator and compares the signal provided by the comparator to a reference voltage to provide an output signal, the reference voltage being between a high and a low voltage state.

20 Claims, 4 Drawing Sheets

5,694,362

1

METHOD AND APPARATUS FOR HIGH SPEED COMPARISON

TECHNICAL FIELD

This invention relates generally to the field of computer logic design, and more particularly, to high speed comparison logic circuits.

BACKGROUND OF THE INVENTION

Integrated circuits, such as microprocessors, frequently require logic circuits capable of high speed comparison of data. For example, current microprocessors typically employ cache memory for improved speed and performance. Caching techniques are well known in the art, and examples are described in Hennessey et al., "Computer Architecture, A Quantitative Approach," Morgan Kaufmann Publishers Inc., incorporated herein by reference. When an instruction is executed by a microprocessor having cache memory, the cache must first be checked to determine whether the required block of main memory is present in the cache. To enable this determination, each block of cache memory is provided with an address tag which identifies the block of main memory which is stored therein. Consequently, checking for the required memory block involves comparing a desired address with each tag until a match is found, or until all tags have been checked. In addition to tag comparison, numerous other applications for comparison logic will occur to those skilled in the art.

FIG. 1 shows an example of a dynamic comparison circuit. In this case, it is desired to compare bit X0 with bit Y0. As is conventional in digital logic, each bit may be in one of two possible states—a high voltage state, sometimes referred to as a logic level 1, and a low voltage state, sometimes referred to as a logic level 0. Thus, bits are said to be high or low. Therefore, it will be understood that comparing two bits means determining if each bit is in the same state.

The actual voltage levels defining the high and low voltage states depends on the technology used to fabricate the integrated circuits and, to some degree, is a matter of design choice. Typically a high voltage state is about equal to the power supply voltage Vdd, and a low voltage state is about ground. The circuit of FIG. 1 comprises precharge transistor 12 connected between a supply voltage, Vdd, and an output line 14. Precharge transistor 12 is a P-type field effect transistor ("PFET"). The gate of precharge transistor 12 is operated by clock signal CLK. When clock signal CLK is low precharge transistor 12 is turned on and output line 14 is charged to approximately the supply voltage, Vdd. When clock signal CLK goes high transistor 12 is turned off, and output line 14 is allowed to conditionally discharge through a comparison network 24 comprising transistor 16, 18, 20 and 22.

In this illustration, comparison network 24 is basically an XNOR circuit in which transistors 16 and 18 form a first possible discharge path, or "leg", and transistors 20 and 22 form a second leg through which the charge on line 14 can flow to ground. If bit X0 is at a different logic level than bit Y0, one of the legs in comparison network 24 will be activated, i.e. both transistors turned on, and will provide a discharge path for line 14. For example, if X0 is high and Y0 is low, then the first leg will be activated and the charge on line 14 will flow to ground through transistors 16 and 18.

One comparison network 24 must be provided for pair of bits to be simultaneously compared. This means that to simultaneously compare n pairs of bits, n comparison networks must be provided along output line 14. However, as

2 additional comparison networks are provided on line 14, the capacitance of line 14 increases proportionately, and more charge must be drained off line 14 in the event of a mismatch between the compared bits. This is especially problematic considering that in some applications data comparisons well over 100 bits wide are not uncommon. Moreover, even in such large comparisons, the data may only differ by 1 bit. Thus, in a worse case scenario, the charge on a highly capacitive output line would drain through only one leg of one comparison network. This requires a great deal of time and degrades circuit performance.

One way to address the above difficulty is described with respect to FIG. 1A. This technique involves breaking the comparison up into smaller sections, or stages, then ANDing the results together. Specifically, FIG. 1A illustrates a circuit useful for simultaneously comparing two 32-bit data values, denoted X and Y. Each 32-bit value has been divided into four 8-bit segments.

In first segment, bits X0–X7 are compared with bits Y0–Y7 and the result is reflected on output line 104 which is coupled to precharge transistor 105. Bit X0 is compared to bit Y0 by a comparison network comprising transistors 112, 114, 116 and 118 in a manner similar to that described with respect to FIG. 1. Similar networks are duplicated for bits X1–X7 and Y1–Y7.

In the same way, bits X8–X15 are compared to bits Y8–Y15, bits X16–X23 are compared with bits Y16–Y23, and bits X24–X31 are compared with bits Y24–Y31. The results are provided on lines 106, 108 and 110 respectively.

In this way, the capacitance on lines 104, 106, 108 and 110 remains reasonably low, allowing for a fast comparison on each 8-bit segment. These results are then provided to AND gate 100 which generates an output 102 which is low only if there is a mismatch on one of the bits.

For a 64-bit comparison, the entire circuit of FIG. 1A is duplicated for bits X32–X63 and Y32–Y63, and the output of this circuit is then ANDed with output 102. This technique could be similarly extended for data comparisons greater than 64-bits in width.

Although there are other ways in which the data could be segmented for comparison, the technique illustrated in FIG. 1A suffers from several disadvantages. For example, additional logic, such as AND gate 100 and precharge transistors 107, 109 and 111, is required. Moreover, as the comparison data is broken into smaller segments, the amount of additional logic is increased. This additional logic will add additional time delay. Further, on a mismatch, at least one of the output lines 104, 106, 108 an 110 must be pulled substantially to ground output 102 will go low. If there is only a 1 bit mismatch, then the time required to drain the charge from the output line could be substantial.

Accordingly, it is an object of the present invention to overcome the above difficulties and to provide further improvements and advantages which will become apparent in view of the following disclosure.

SUMMARY OF THE INVENTION

One aspect of the invention relates to a dynamic comparison circuit for comparing a plurality of data bits, each data bit being in either a high or a low voltage state. In one embodiment, the dynamic comparison circuit comprises a comparator which provides a signal responsive to a comparison of the voltage states of at least two of the plurality of data bits; and an amplifier which is coupled to the comparator and compares the signal provided by the comparator to a reference voltage to provide an output signal, the reference voltage being between a high and a low voltage state.

In another embodiment, the comparison circuit comprises a comparator having a first input responsive to the voltage state of a first data bit, a second input responsive to the voltage state of a second data bit, and an output which provides a signal having a voltage level responsive to a comparison of the voltage state of the first and second data bits; and an amplifier having a first input coupled to the output of the comparator, a second input coupled to a reference voltage, and an output which provides a signal responsive to a comparison of the voltage level of the output of the comparator and the reference voltage.

Another aspect of the invention relates to a method for comparing data bits in a digital circuit, each data bit having either a high or a low voltage level. According to one embodiment, the method comprises precharging an output of a comparison circuit to a high voltage level; providing first and second bits to the comparison circuit; coupling the output of the comparison circuit to ground if the voltage level of the first bit is different than the voltage level of the second bit; comparing the voltage level of the output of the comparison circuit to a reference voltage which is between the high voltage level and the low voltage level; and providing an output signal responsive to the comparison.

DETAILED DESCRIPTION OF THE EMBODIMENTS OF THE INVENTION

Figure 2:
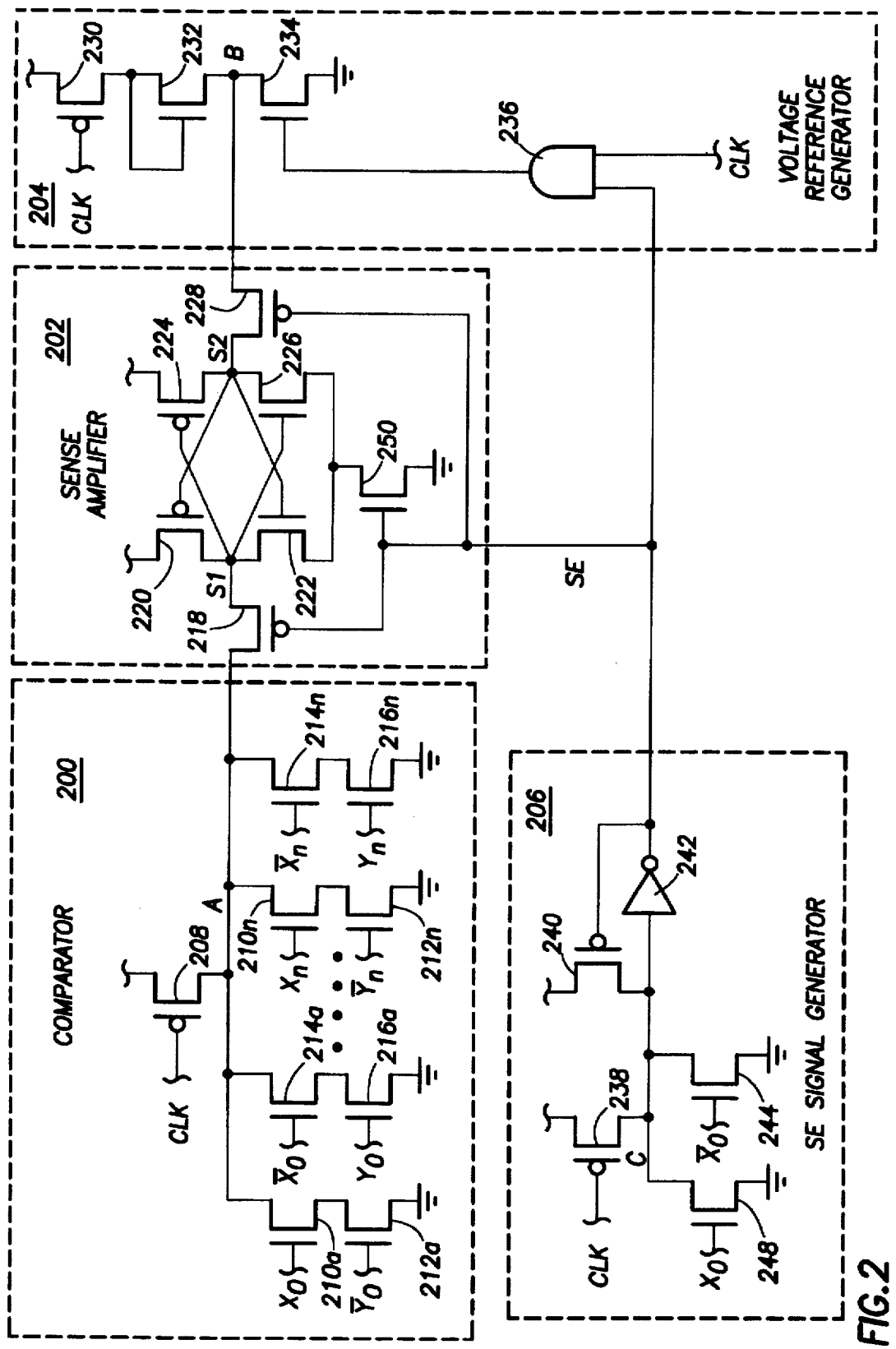
FIG. 2 is a schematic diagram of a n bit comparison circuit according to an embodiment of the invention.

FIG. 2 shows a schematic diagram of a comparison circuit according to an embodiment of the invention which compares two data values, X and Y, each being n-bits wide. In this embodiment, the circuit comprises a comparator 200, an amplifier 202, a voltage reference generator 204, and a signal generator 206.

Comparator 200 comprises precharge transistor 208 which is connected between a supply voltage Vdd and output line, or node, A. Precharge transistor 208 is operated by signals on clock signal line CLK provided to its gate. The operation of transistor 208 is conventional in that when clock signal line CLK is low, the transistor is on and output line A is precharged high. Conversely, when clock signal line CLK is high, transistor 208 is turned off and output line A conditionally discharges.

A plurality of comparison networks are connected between output line A and ground. An exemplary comparison network comprises transistors 210a, 212a, 214a and 216a which compares bit X0 with bit Y0. As shown, for an n-bit wide comparison, n comparison networks are provided along output line A until bits Xn and Yn are compared by the nth comparison network comprising transistors 210n, 212n, 214n and 216n. The operation of individual comparison networks has been described previously. Of course, the comparison network illustrated is only one suitable example and numerous others will occur to those skilled in the art. It will be appreciated that a comparison network can be any combination of logic which creates a discharge path in the event of a bit mismatch.

The source of data values X and Y is, of course, immaterial to the operation of the present invention and will be understood by those skilled in the art to include data from registers, main memory, cache memory, etc., plus un-stored data provided directly from buses coupled to other circuits on the chip. Output line A is provided to node S1 of amplifier 202 via transistor 218.

In this embodiment, amplifier 202 is a conventional sense amplifier comprising transistors 220, 222, 224 and 226. The amplifier is evaluated when signal line SE goes high, which turns on evaluation transistor 250 and turns off isolation transistors 218 and 228, thus isolating the amplifier 202 from the rest of the circuit during evaluation. As is clear from the figure, if the voltage level at node S1 is higher than the voltage level at node S2, then, on evaluation, the amplifier 202 operates to pull node S 1 high and node S2 low. Conversely, if the voltage level on node S1 is lower than the voltage level on node S2 then node S1 is pulled low while node S2 is pulled high. The specific amplifier illustrated is, of course, only one suitable example and numerous other suitable amplifier designs are well known in the art. Moreover, it is seen that the amplifier functions to provide a comparison between the voltage level at node A and the reference voltage at node B, and therefore, it is understood that, in alternate embodiments, the amplifier can be any circuit suitable for performing this function.

Voltage reference generator 204 comprises precharge transistor 230 whose drain is coupled to the drain and gate of transistor 232. The drain of transistor 232 is connected to node B which is in turn connected to ground via transistor 234. The gate of transistor 234 is operated by AND gate 236 having one input connected to clock signal line CLK and another input coupled to signal generator 206.

When clock signal line CLK is low, the output of AND gate 236 is also low and transistor 234 is turned off. Simultaneously, PFET transistor 230 is on which pulls node B up to a voltage level of about Vdd minus the threshold voltage of transistor 232 (Vth). This provides a reference voltage which is supplied node S2 of amplifier 202 via PFET transistor 228. Of course, other suitable voltage reference generators will occur to those skilled in the art. In still further embodiments, a band gap reference supplies the voltage at node B. The particular voltage level desired will depend on several factors, such as the number of bits to be compared, the technology in which the circuit is implemented, the particular design of the amplifier, and the desired operating parameters of the circuit. Therefore, it will be appreciated that the voltage level provided at node B during precharge is largely a matter of design choice. In a specific embodiment of the invention, the voltage level at node B is about 200 mV below Vdd.

It should be noted that transistor 234 is provided to prevent charge buildup at node B. Specifically, when clock signal line CLK goes high and signal generator line SE is also high, then the output of AND gate 236 will turn on transistor 234 and drain the charge off node B. This ensures an accurate voltage level at node B at the end of each precharge phase.

Signal generator 206 comprises precharge transistor 238 connected between Vdd and node C. A discharge path from node C is provided by transistors 248 and 244. In this case, transistors 248 and 244 are operated by signals corresponding to the logic level of bit X0 and its compliment, respectively. Node C is coupled to the input of inverter 242, and the output of inverter 242 is connected to signal line SE. Output SE is also provided in a feedback loop to transistor 240, coupled between Vdd and node C. Signal generator 206 provides a properly timed evaluation signal to amplifier 202 and voltage reference generator 204 as will be described in greater detail herein.

During the precharge phase, clock signal line CLK is low; therefore, PFET transistors 208, 230 and 238 are all on. This causes nodes A and C to be pulled high. The high logic level at node C is inverted by inverter 242 which pulls signal line SE low. Consequently, the output of AND gate 236 is also low, and transistor 234 of voltage reference generator 204 is off. This enables node B to be precharged to a voltage level of about Vdd minus Vth.

The low voltage level on line SE also turns off transistor 250, which functions as an evaluation transistor for amplifier 202. At the same time, PFET transistors 218 and 228 are turned on, allowing nodes S1 and S2 to be charged to approximately the same voltage levels as nodes A and B, respectively. In one version of the invention, it is advantageous to set at all bits of data values X and Y, and their compliments, low during the precharge phase. This prevents a discharge path from being activated on nodes A and C while precharge transistors 208 and 238 are attempting to pull the nodes high.

During the evaluation phase, clock signal line CLK goes high, thus turning off transistors 208, 230 and 238. Signals representative of the status of bits X0–Xn and Y0–Yn, and their compliments, are provided to the comparison networks coupled to node A. If there is a mismatch between the voltage level of any bit of data values X and Y, then a discharge path will be created from node A to ground, and node A will begin to be pulled low.

Simultaneously, a signal representative of the voltage level of bit X0 is provided to the gate of transistor 248 while the compliment signal is provided to the gate of transistor 244. Since one of the signals must be high, one of transistors 248 or 244 is turned on, pulling node C low. This arrangement ensures that node C will not be pulled low until the arrival of data information from data value X. Thus, amplifier 202 will not be evaluated until data value X has been received by comparator 200. Of course, it will be appreciated that the signal generator could be activated by the arrival of any of bits X0–Xn or Y0–Yn, and their compliments, or any combination thereof. In another version of the invention, it is advantageous to connect the gates of transistors 248 and 244 to the latest arriving signals representative of data bits X0–Yn to ensure proper timing of the evaluation of amplifier 202.

It is understood that, in this embodiment, node C has a much lower capacitance than node A since it is coupled to ground by only two transistors. Therefore, assuming there is a mismatch, node C will go low much sooner than node A. When node C goes low, inverter 242 causes signal line SE to go high which causes amplifier 202 to evaluate voltages at nodes S1 and S2. Since, as discussed previously, node C discharges faster than node A, inverter 242 also performs a function of providing a slight time delay in which node A can discharge. Therefore, it will be appreciated that if a mismatch occurs, the evaluation of amplifier 202 is delayed long enough for the voltage on node A to be pulled slightly lower than the voltage on node B. If necessary, this time delay can be further increased by, for example, the addition of a delay circuit.

If the information in data value X matches, bit for bit, with the information in data value Y, then there is no mismatch and node A will remain high during the evaluation phase. In this case, when signal line SE goes high, transistor 250 is turned on and PFET transistors 218 and 228 are turned off. This isolates the amplifier 202 from the voltage reference generator 204 and the comparator 200 while simultaneously providing a discharge, or evaluation, path to ground. Since node S1 is at about Vdd and node S2 is at about Vdd minus Vth, amplifier 202 will cause node S1 to remain high while node S2 is pulled low.

In the event of a mismatch, node A will begin to be pulled low through whichever comparison network, or networks, are activated. Signal line SE, after the arrival of signal X0 and its compliment, plus the delay due to inverter 242, will go high. In one advantageous embodiment, the delay of inverter 242 is just enough so that node a falls slightly below node B (Vdd-Vth, in this case), before signal line SE goes high. When signal line SE goes high, transistor 250 is turned on and transistors 218 and 228 are turned off, just as before. However, in this case, node S1 is actually at a lower voltage level than node S2 and amplifier 202 causes node S2 to go high while S1 is pulled low.

The output of the comparison circuit shown in FIG. 2 is taken at nodes S1 and S2 of amplifier 202. Thus, the circuit provides a dual rail output wherein a high value on node S1 at the end of the evaluation indicates there is no mismatch between data values X and Y, and a low value indicates there is a mismatch. The reverse being true for node S2.

When clock signal CLK again goes low, the comparison circuit re-enters the precharge phase. Transistors 208, 230 and 238 are again turned on, and nodes A, B and C are pulled to their respective voltage levels discussed previously. Signal line SE goes low, mining off transistor 250 and coupling nodes A and B to nodes S1 and S2 via transistors 218 and 228, respectively. The circuit is now ready to evaluate the next pair of data values when clock signal CLK goes high.

As discussed previously, it is advantageous to pull the signal lines representative of data bits X0–Xn and Y0–Yn low before the precharge phase. In one embodiment of the invention, a circuit pulling the data lines low is coupled to signal line SE such that when SE goes high the data lines are pulled low. This will not affect the results of the evaluation of sense amplifier 202 because transistors 218 and 228 isolate the sense amplifier 202 from the comparator 200 and the voltage reference generator 204 during the evaluation phase. Thus, this provides a self-reset feature and allows more precise timing of the comparison circuit.

Figure 1:
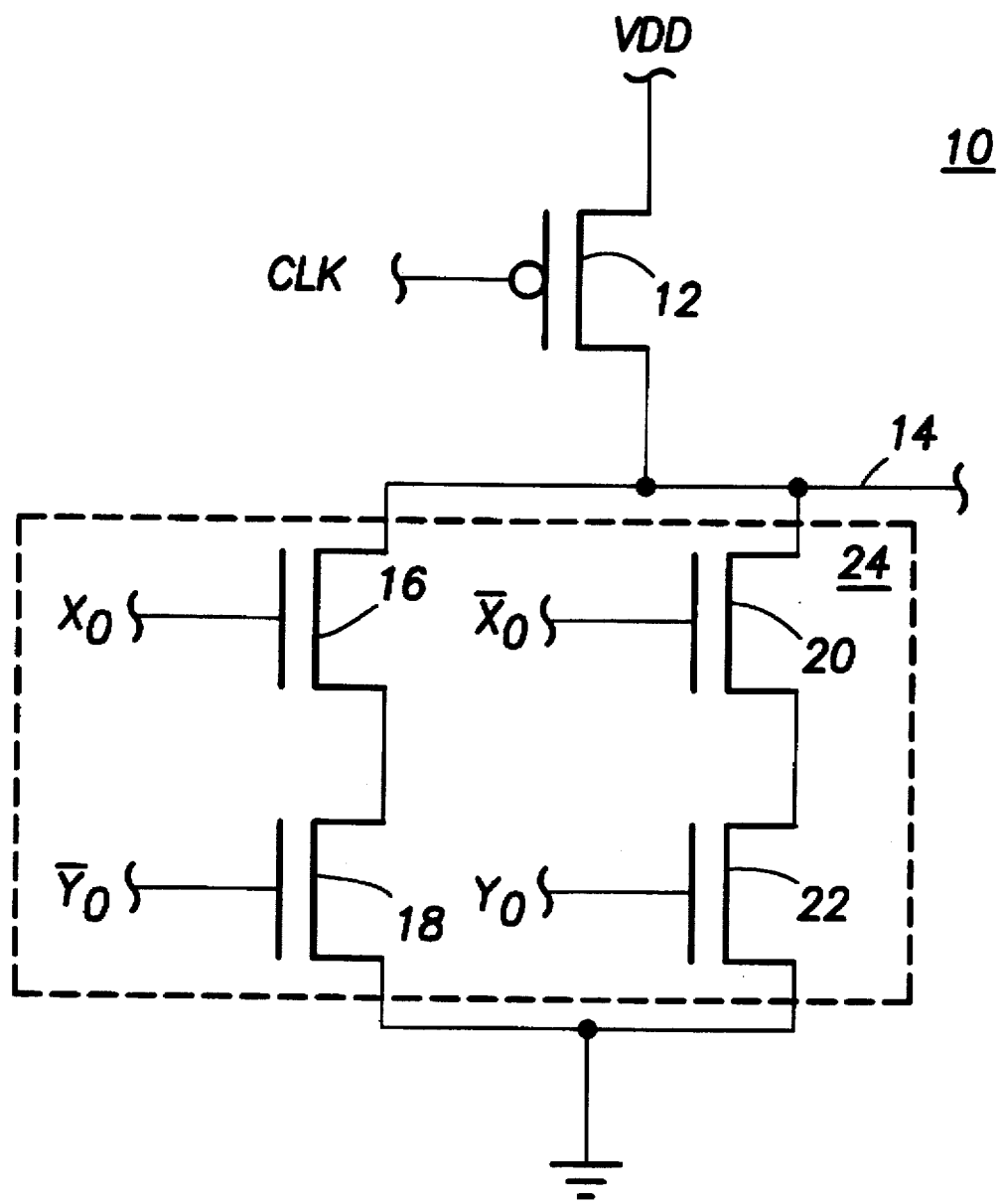
FIG. 1 is a schematic diagram of a 1-bit comparison circuit.
Figure 1A:
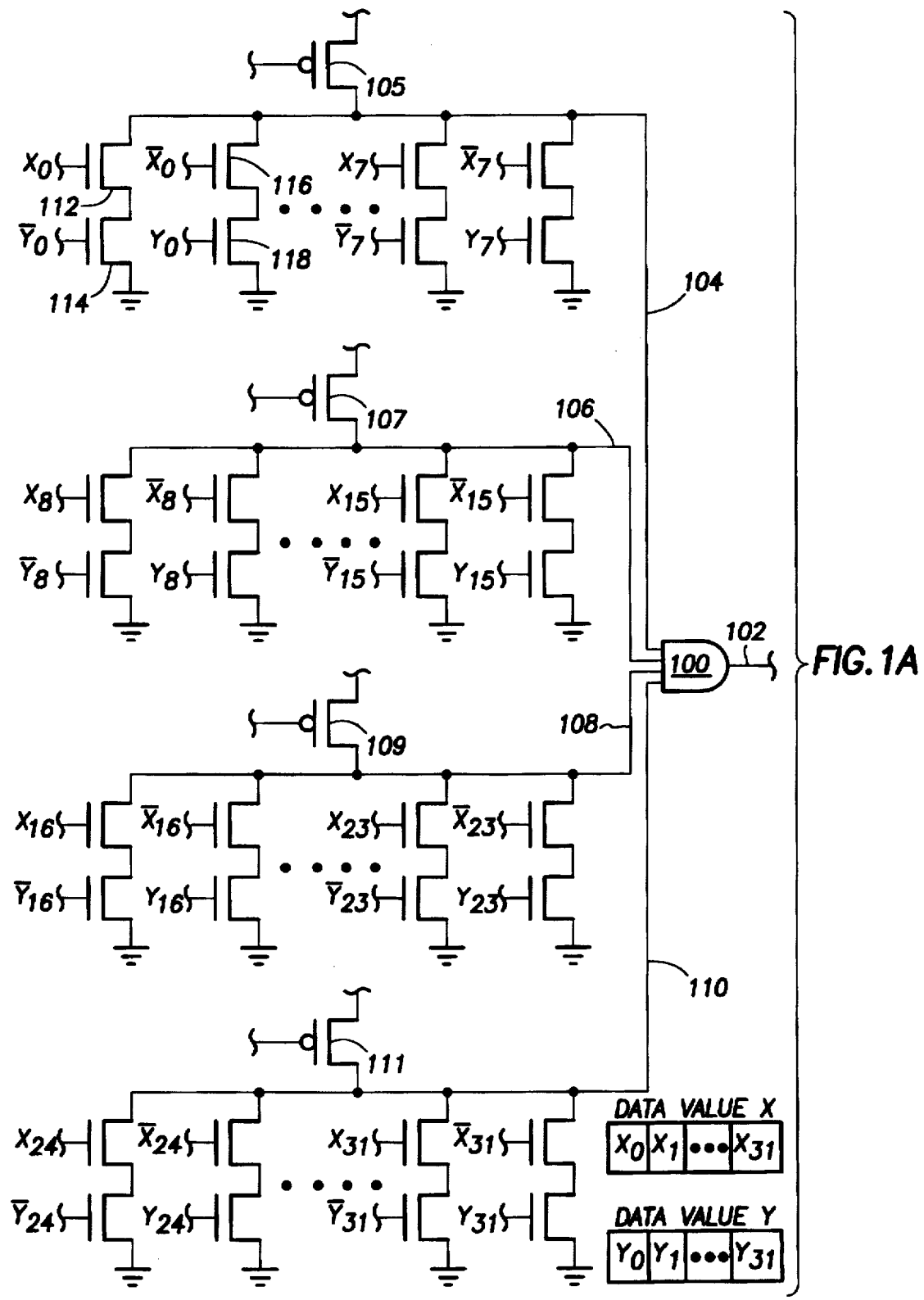
FIG. 1A is a schematic diagram of a 32-bit comparison circuit.

It should be apparent to those skilled in the art that one advantageous feature of the invention is that the circuit does not require that node A, a high capacitance node, be pulled to ground before the comparison results can be determined. Rather, node A need only be pulled lower than the reference voltage on node B before the amplifier 202 is evaluated. Not only does this result in improved performance, but the large size of the comparison network transistors, advantageous in the circuit of FIG. 1A, is not necessary. Therefore, in another embodiment of the invention, the transistors 210a–216n are made as small as the minimum size of fabrication technology will allow. For a wide comparison, this results in substantial savings of chip real estate.

Figure 3:
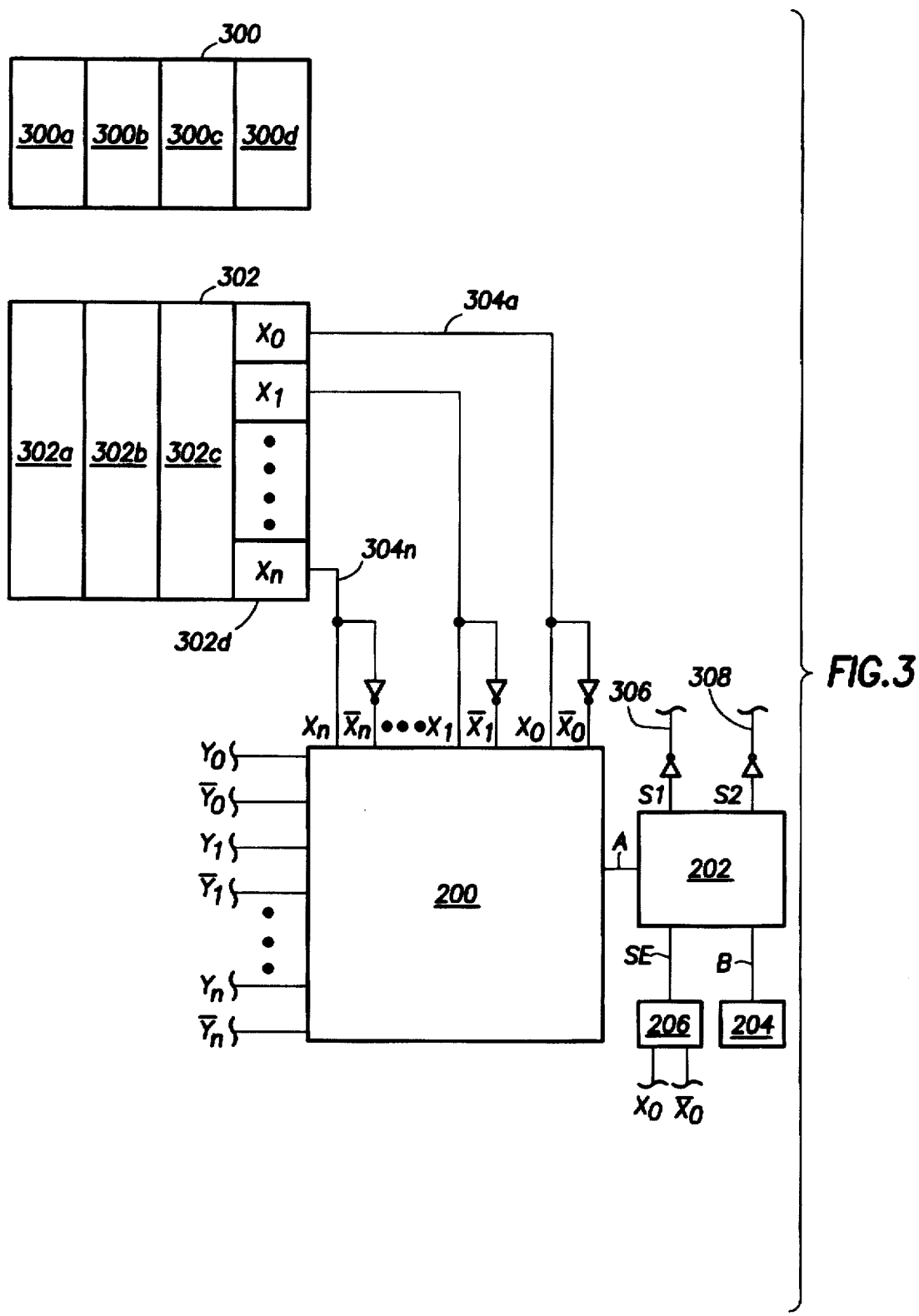
FIG. 3 is a block diagram of an embodiment of the invention useful in cache memory applications.

Referring now to FIG. 3, an embodiment of the invention is shown which is adapted to provide a fast tag comparison for cache memory. In this embodiment, cache memory 300 comprises four memory blocks 300a–300d. Each block has an associated tag address 302a–302d stored in tag register block 302a. Each address comprises a plurality of bits which identify the block of main memory which is stored in cache memory 300. In the embodiment illustrated, tag 302d comprises address bits X0–Xn. These address bits are output on data lines 304a–304n which pass signals representing the state of the address bits, and their compliments, to comparator circuit 200. The signals Y0–Yn, and compliments thereof, are provided to comparator 200 from circuitry (not shown) which identifies the desired address of the memory containing the next block of instructions to be executed by the processor. These signals are compared as described previously, and the result of the comparison is provided on line A to sense amplifier 202. As explained previously, when signal line SE from signal generator 206 goes high, amplifier 202 compares the voltage level to signal line A with the voltage on signal line B from the voltage reference generator 204 and pulls outputs S1 and S2 high, or low, depending on the comparison.

Of course, this represents only one of many possible applications for the comparison circuit described herein, and numerous others will occur to those with skill in the art.

While the invention has been particularly shown and described with reference to the above embodiments, it will be understood by those skilled in the art that various changes in form and detail may be made therein without departing from the scope and spirit of the invention.

What is claimed is:

1. A comparison circuit for comparing a plurality of data bits, each data bit being in either a high or a low voltage state, the comparison circuit comprising:
   a comparator which provides a signal responsive to a comparison of the voltage states of at least two of the plurality of data bits;
   an amplifier which is coupled to the comparator and compares the signal provided by the comparator to a reference voltage to provide an output signal, the reference voltage being between a high and a low voltage state, and an evaluation signal generator comprising an inverter having an input coupled to a precharge transistor, the input having a conditional discharge path responsive to the voltage level of at least one of the plurality of data bits.

2. A comparison circuit as in claim 1 wherein the amplifier is electrically isolatable from the comparator and the reference voltage.

3. A comparison circuit as in claim 1 wherein the amplifier is coupled to the comparator and the reference voltage by isolation transistors responsive to an evaluation signal.

4. A comparison circuit as in claim 1 further comprising a voltage reference generator.

5. A comparison circuit as in claim 4 wherein the voltage reference generator comprises a precharge PFET transistor, a first NFET transistor and a second NFET transistor, the drain and gate of the first NFET transistor being coupled to the drain of the precharge PFET transistor, the source of the first NFET transistor being coupled to the drain of the second NFET transistor, the source of the second NFET transistor being coupled to the ground.

6. A comparison circuit as in claim 1 wherein the comparator comprises a signal line coupled to a precharge transistor and at least one comparison network.

7. A comparison circuit as in claim 6 wherein the comparison network performs an XNOR with respect to signals representative of the voltage states of the at least two data bits and compliments thereof.

8. A comparison circuit as in claim 6 wherein the comparison network comprises two discharge paths coupling the signal line to ground, each discharge path comprising a pair of series connected transistors.

9. A comparison circuit as in claim 8 wherein the pair of transistors in each discharge path comprises a first transistor having a gate which receives a signal representative of the voltage level of a first bit and a second transistor having a gate which receives a signal representative of the voltage level of a compliment of the second bit.

10. A comparison circuit for comparing a plurality of data bits, each data bit being in either a high or a low voltage state, the comparison circuit comprising:
    a comparator having a first input responsive to the voltage state of a first data bit, a second input responsive to the voltage state of a second data bit, and an output which provides a signal having a voltage level responsive to a comparison of the voltage state of the first and second data bits;
    an amplifier having a first input coupled to the output of the comparator, a second input coupled to a reference voltage, and an output which provides a signal responsive to a comparison of the voltage level of the output of the comparator and the reference voltage, and
    an evaluation signal generator which provides a conditional discharge path for the reference voltage, the evaluation signal generator being responsive to the voltage level of at least one of the plurality of data bits.

11. A comparison circuit as in claim 10 wherein the evaluation signal generator comprises an inverter having an input coupled to a precharge transistor, the input having a conditional discharge path responsive to the voltage level of at least one of the plurality of data bits.

12. A comparison circuit as in claim 10 wherein the comparator comprises:
    a precharge transistor coupled between a supply voltage and the output;
    a comparison network coupled between the output and ground which provides a discharge path from the output to ground responsive to the signals received by the first and second inputs.

13. A comparison circuit as in claim 12 wherein the comparison network comprises:
    a first pair of series connected transistors coupled between the output and ground, one transistor of the first pair being responsive to the voltage state of a first data bit, the other transistor of the first pair being responsive to a compliment of the voltage level of the second data bit;
    a second series connected pair of transistors coupled between the output and ground, one of the second pair of transistors being responsive to a compliment of the voltage state of the first data bit, the other being responsive to the voltage state of the second data bit.

14. A method for comparing data bits in a digital circuit, each data bit having either a high or a low voltage level, the method comprising:
    precharging an output of a comparison circuit to a high voltage level;
    providing first and second bits to the comparison circuit;
    coupling the output of the comparison circuit to ground if the voltage level of the first bit is different than the voltage level of the second bit;
    comparing the voltage level of the output of the comparison circuit to a reference voltage which is between the high voltage level and the low voltage level, the comparison comprising:
    providing the voltage level of the output of the comparison circuit to a first input of a sense amplifier;
    providing the reference voltage to a second input of the sense amplifier;
    providing an evaluation signal to create a conditional discharge path for the reference voltage, the evaluation signal being responsive to the voltage level of at least one of the data bits;

providing an output signal responsive to the comparison.

15. A method as in claim 14 wherein precharging the output of a comparison circuit comprises coupling the output of the comparison circuit to a supply voltage by turning on a transistor, the transistor being responsive to a clock signal.

16. A method as in claim 14 wherein coupling the output of the comparison circuit to ground comprises turning on a pair of series connected transistors coupled between the output of the comparison circuit and ground, one of the pair being responsive to the voltage level of the first data bit, the other of the pair being responsive to a compliment of the voltage level of the second data bit.

17. A method as in claim 14 wherein comparing the voltage level of the output of the comparison circuit to a reference voltage comprises:

isolating the sense amplifier from the comparison circuit and the reference voltage and evaluating the sense amplifier in response to the evaluation signal.

18. A method as in claim 17 wherein isolating the sense amplifier comprises turning off a pair of transistors, each transistor being responsive to the evaluation signal, one of the pair being disposed between the comparison circuit and the sense amplifier the other of the pair being disposed between the reference voltage and the sense amplifier.

19. A method as in claim 14 wherein providing an evaluation signal comprises:

precharging an input of an inverter to a high voltage level;

providing the first bit to a gate of a first transistor coupled between the input of the inverter and ground;

providing a compliment of the first bit to a gate of a second transistor coupled between the input of the inverter and ground.

20. A method as in claim 19 wherein precharging an input of an inverter comprises turning on a transistor coupled between a supply voltage and the input of the inverter, the transistor being responsive to the clock signal.

* * * * *